United States Patent
Cheng et al.

(10) Patent No.: US 11,031,485 B2
(45) Date of Patent: Jun. 8, 2021

(54) TRANSISTOR WITH AIRGAP SPACER

(71) Applicant: International Business Machines Corporation, Armonk, NY (US)

(72) Inventors: Kangguo Cheng, Schenectady, NY (US); Juntao Li, Cohoes, NY (US); Ruilong Xie, Niskayuna, NY (US); Chanro Park, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/430,504

(22) Filed: Jun. 4, 2019

(65) Prior Publication Data

US 2020/0388694 A1  Dec. 10, 2020

(51) Int. Cl.
*H01L 29/66* (2006.01)
*H01L 29/78* (2006.01)
*H01L 29/51* (2006.01)

(52) U.S. Cl.
CPC ........ *H01L 29/6653* (2013.01); *H01L 29/515* (2013.01); *H01L 29/6656* (2013.01); *H01L 29/78* (2013.01)

(58) Field of Classification Search
CPC .............. H01L 29/6653; H01L 29/515; H01L 29/6656; H01L 29/78
See application file for complete search history.

(56) References Cited

U.S. PATENT DOCUMENTS

| | | | |
|---|---|---|---|
| 5,959,337 A | 9/1999 | Gardner et al. | |
| 6,127,711 A | 10/2000 | Ono | |
| 7,977,751 B2 | 7/2011 | Nagaoka et al. | |
| 9,419,091 B1 * | 8/2016 | Leobandung | ..... H01L 29/66772 |
| 9,666,533 B1 | 5/2017 | Basker et al. | |
| 9,773,881 B2 | 9/2017 | Cheng et al. | |
| 9,831,119 B2 | 11/2017 | Kim | |
| 10,026,824 B1 | 7/2018 | Chanemougame et al. | |
| 10,177,237 B2 | 1/2019 | Cheng et al. | |
| 2018/0076199 A1 * | 3/2018 | Wang | .................... H01L 27/088 |
| 2018/0374927 A1 * | 12/2018 | Liu | ................... H01L 29/42376 |
| 2020/0035804 A1 * | 1/2020 | Chen | ................. H01L 21/28088 |
| 2020/0098886 A1 * | 3/2020 | Liu | ..................... H01L 27/0886 |

FOREIGN PATENT DOCUMENTS

KR  20050121521 A  12/2005
WO  WO-2017111770 A1 *  6/2017  ....... H01L 29/66659

* cited by examiner

*Primary Examiner* — Christine A Enad
(74) *Attorney, Agent, or Firm* — Cantor Colburn LLP; Douglas Pearson

(57) ABSTRACT

A semiconductor device includes a gate having a gate spacer formed on a semiconductor substrate and a source or drain (S/D) formed on the substrate a distance away from the gate. A S/D contact including a contact spacer is formed on an upper surface of the S/D. A dielectric layer is interposed between the gate spacer and the contact spacer; and an airgap is in the dielectric layer.

16 Claims, 15 Drawing Sheets

TRANSISTOR WITH AIRGAP SPACER

BACKGROUND

The present invention relates in general to semiconductor device fabrication methods and resulting structures. More specifically, the present invention relates to fabrication methods and resulting structures for a semiconductor device having an air spacer between a gate and a contact, and having an air gap between metal interconnect layers.

In contemporary semiconductor device fabrication processes, a large number of semiconductor devices, such as field effect transistors (FETs), are fabricated on a single wafer. The channel of a FET is controlled by a gate electrode. The gate electrode is electrically isolated from source and drain electrodes by a spacer material formed on the sidewall of the gate electrode.

SUMMARY

According to embodiments of the present invention, a method is provided for forming a semiconductor device. The method comprises forming a gate structure on a substrate; forming a sacrificial region between the gate structure and a contact spacer; recessing one or both of the gate structure and the contact spacer to enlarge the sacrificial region; and depositing a dielectric material in the enlarged sacrificial region to form an airgap between a remaining portion of the contact spacer and the gate structure.

According to embodiments of the present invention, another method of fabricating a semiconductor device provided. The method comprises forming a gate on a substrate; forming a multi-layer spacer on sidewalls of the gate; and forming opposing lower and upper divots in a sacrificial layer of the multi-layer spacer. The method further comprises filling the opposing divots with a hardmask material to form lower and upper divot plugs such that a remaining portion of the sacrificial layer is completely encased, and removing the upper divot plug and etching away the remaining portion of the sacrificial layer to form a void in the multi-layer spacer. The method further comprises etching the multi-layer spacer to increase the size of the void; and depositing a dielectric material in the void so that an upper portion and lower portion of the void are completely filled without completely filling a middle portion of the sacrificial region to form the airgap in the multi-layer space.

According to embodiments of the present invention, a semiconductor device includes a gate having a gate spacer formed on a semiconductor substrate and a source or drain (S/D) formed on the substrate a distance away from the gate. A S/D contact including a contact spacer is formed on an upper surface of the S/D. A dielectric layer is interposed between the gate spacer and the contact spacer; and an airgap is in the dielectric layer.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

FIGS. 1-15 depict a semiconductor structure after fabrication operations for forming a transistors having airgap spacers in accordance with aspects of the invention, in which:

FIG. 1 depicts a cross-sectional view of the semiconductor structure after an initial set of fabrication operations have been used to form the semiconductor structure having a gate stack formed on a semiconductor substrate according to embodiments of the invention;

FIG. 2 depicts the semiconductor structure of FIG. 1 wherein a plurality spacer layers have been formed on the gate stack according to embodiments of the invention;

FIG. 3 depicts the semiconductor structure of FIG. 2 after etching the spacer layers to form a sacrificial layer interposed between a gate spacer and a contact spacer according to embodiments of the invention;

FIG. 4 depicts the semiconductor structure of FIG. 3 after partially etching the upper and lower portions of the sacrificial layer to form upper and lower divots according to embodiments of the invention;

FIG. 5 depicts the semiconductor structure of FIG. 4 after forming divot plugs in the upper and lower divots according to embodiments of the invention;

FIG. 6 depicts the semiconductor structure of FIG. 5 after forming source/drains on the semiconductor substrate according to embodiments of the invention;

FIG. 7 depicts the semiconductor structure of FIG. 6 after forming interlayer dielectrics according to embodiments of the invention;

FIG. 8 depicts the semiconductor structure of FIG. 7 after performing a replacement metal gate process according to a non-limiting embodiment of the invention;

FIG. 9 depicts the semiconductor structure of FIG. 8 after forming source/drain contacts according to a non-limiting embodiment of the invention;

FIG. 10 depicts the semiconductor structure of FIG. 9 after partially recessing the sacrificial layer and the interlayer dielectrics according to embodiments of the invention;

FIG. 11 depicts the semiconductor structure of FIG. 10 after depositing interlayer dielectric caps to cover the interlayer dielectrics according to embodiments of the invention;

FIG. 12 depicts the semiconductor structure of FIG. 11 after removing the sacrificial layers to form spacer voids according to embodiments of the invention;

FIG. 13 depicts the semiconductor structure of FIG. 12 after enlarging the spacer voids according to embodiments of the invention;

FIG. 14 depicts the semiconductor structure of FIG. 13 after depositing a dielectric material in the spacer voids; and FIG. 15 depicts the semiconductor structure of FIG. 14 after planarizing an excess portion of the dielectric material to form airgap spacers according to embodiments of the invention.

DETAILED DESCRIPTION

Figure 1:
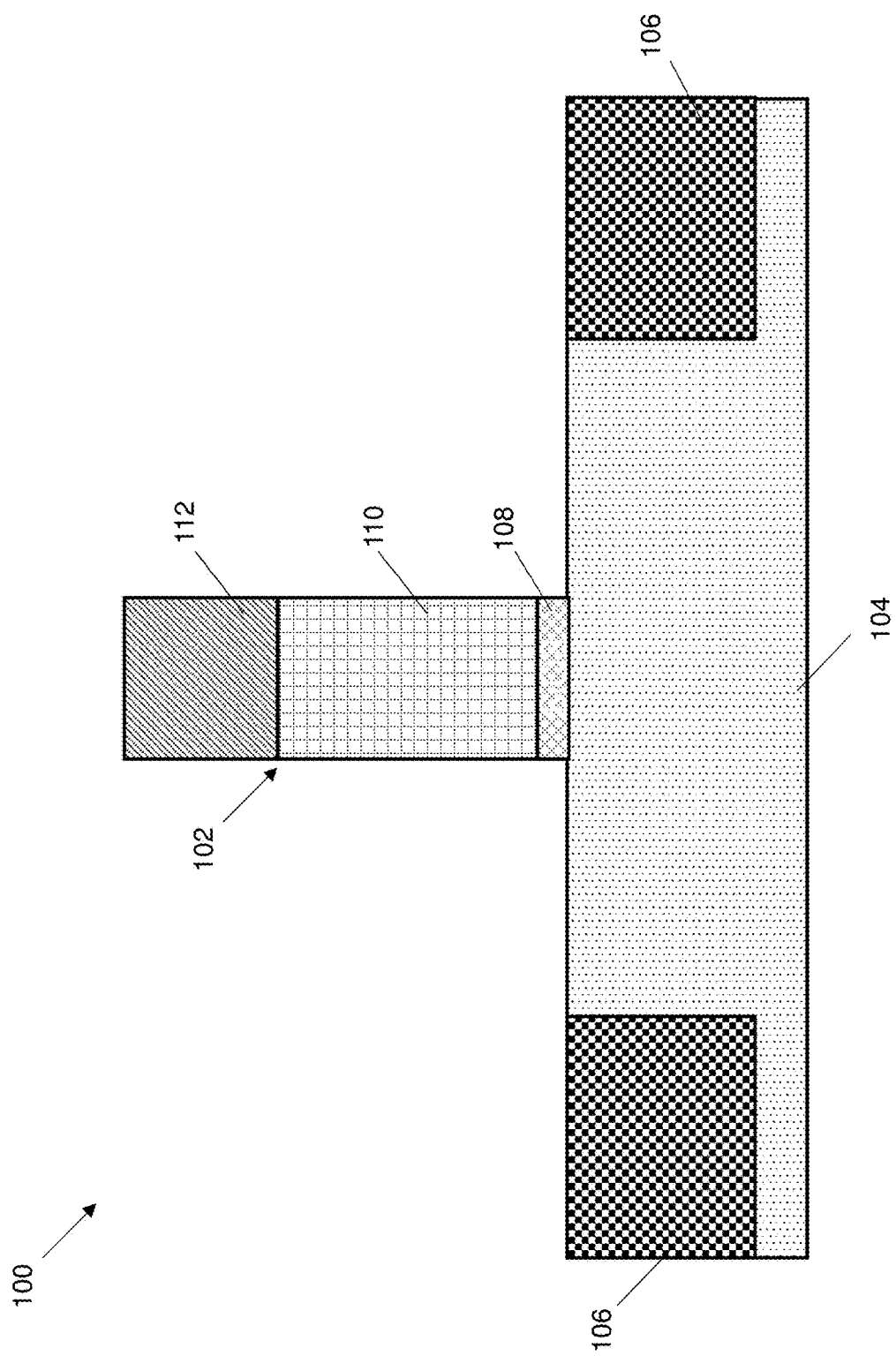

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a more detailed description of technologies relevant to the present invention, as device dimensions and component spacing shrink, parasitic capacitance in semiconductor device tends to increase. Parasitic capacitance, or conductor-to-conductor capacitance, between two conductors is a function of the length and thickness of the conductors, as well as the distance separating the conductors. Various non-planar transistor device architectures, such as FinFETs, nanosheet FETs, nanowire FETs, have been developed to continue the scaling of CMOS technology. As the features of an FET are reduced in size and increased in aspect ratio, parasitic capacitance effects between features are exacerbated. For example, during front end of line (FEOL) fabrication at the sub-10 nm node, the parasitic capacitance between a gate and an adjacent contact becomes significant. In another example, during back end of line (BEOL) fabrication at intra-level spacing below about 15 nm, parasitic capacitance between interconnects becomes significant. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. Thus, a sidewall spacer material such as air, for example, that has a low dielectric constant (k) can be employed for reducing the capacitance between a gate and an adjacent contact, between gate and source and/or between gate and drain. However, it is difficult to fabricate an FET having such air-filled sidewalls.

Turning now to an overview of aspects of the present invention, one or more embodiments provide methods of fabricating a semiconductor device having an airgap spacer between a gate and a contact. The described methods trap a pocket of air in a dielectric material located between a source/drain contact and the gate. The pocket of air serves as an air spacer between the gate and the contact, which reduces parasitic capacitance between the gate and the opposing source/drain contacts. In other aspects of the present invention, one or more embodiments provide methods of fabricating a semiconductor device having an air gap between interconnects. The described methods form a spacer trench between a gate spacer and an epitaxially grown source/drain, while also providing sufficient distance between the source/drain and the gate to reduce the possibility of gate current leakage. A pocket of air is trapped in the trench by pinching off the upper portion of dielectric material that is deposited in the spacer void. The pocket of air serves as an air gap spacer between the adjacent source/drain contacts.

Turning now to a more detailed description of aspects of the invention, FIGS. 1-15 depict a semiconductor structure 100 after fabrication operations for forming a transistors having airgap spacers in accordance with aspects of the invention. Referring to FIG. 1, the exemplary semiconductor structure 100 according to a non-limiting embodiment of the present invention includes gate structures 102 formed over a semiconductor material portion 104. In one embodiment, for example, the semiconductor material portion 104 can be a portion of a semiconductor fin. As used herein, a "fin" is a structure that has a first pair of sidewalls along a lengthwise direction that is longer than a second pair of sidewalls along a widthwise direction. In another embodiment, the semiconductor material portion 104 can represent a semiconductor active device region of a planar semiconductor substrate. In another embodiment, the semiconductor material portion 104 can represent a semiconductor active device region of a nanowire or nanosheet transistor. The semiconductor material portion 104 can include any semiconductor material known to one of ordinary skill in the art. In some examples, the semiconductor material portion 104 includes a semiconductor material such as, for example, Si, Ge, SiGe, SiC, SiGeC, a III-V compound semiconductor, a II-VI compound semiconductor or any combinations thereof.

In one embodiment, the semiconductor material portion 104 can be formed from a bulk substrate that includes one or more trench isolation regions 106 as is well known to those skilled in the art. The trench isolation regions 106 can include a dielectric material such as silicon dioxide, silicon nitride, silicon oxynitride, boron nitride or a combination thereof. In another embodiment and, the semiconductor material portion 104 can be included as a portion of a semiconductor-on-insulator (SOI) substrate (not shown). The SOI substrate typically includes, from bottom to top, a handle substrate (not shown), a buried insulator layer (not shown) and a top semiconductor layer from which the semiconductor material portion 104 is formed.

In some embodiments of the present application, a hard mask layer (not shown) can be formed on the top semiconductor layer prior to forming the semiconductor material portion 104. When employed, the hard mask layer can include an oxide, nitride, oxynitride or any combination thereof including multilayers. In one embodiment, the hard mask layer includes silicon dioxide or silicon nitride. The hard mask layer can be formed utilizing a conventional deposition process such as, for example, CVD or PECVD. Alternatively, the hard mask layer can be formed by a thermal process such as, for example, oxidation or nitridation of the top semiconductor layer. Any combination of the above mentioned processes can also be used in forming the hard mask layer. The hard mask layer that is formed can have a thickness from 20 nm to 80 nm, although lesser or greater thicknesses can also be employed.

In one embodiment, the semiconductor material portion 104 can be formed by lithography and etching. The lithographic step includes applying a photoresist layer (not shown) atop the top semiconductor layer (or the hard mask, if present), exposing the photoresist layer to a desired pattern of radiation, and developing the exposed photoresist layer utilizing a conventional resist developer. The etching process includes a dry etch such as, for example, reactive ion etch (RIE) and/or a wet etch. The etching process transfers the pattern from the patterned photoresist layer to the top semiconductor layer or first to the hard mask layer, if present, and thereafter to the underlying top semiconductor layer utilizing the buried insulator layer as an etch stop. After transferring the pattern into the top semiconductor layer, the patterned photoresist layer can be removed utilizing a conventional resist stripping process such as, for example, ashing. Alternatively, the semiconductor material portion 104 can also be formed utilizing a sidewall image transfer (SIT) process. In a typical SIT process, spacers are formed on sidewalls of a sacrificial mandrel. The sacrificial mandrel is removed and the remaining spacers are used as a etch mask to etch the top semiconductor layer. The spacers are then removed after the semiconductor material portions have been formed. The semiconductor material portion 104 can also be formed utilizing a direct self-assembly patterning process.

The semiconductor material portion 104 can have a rectangular or other shapes of a horizontal cross-sectional area. The width of the semiconductor material portion 104 can be from 5 nm to 100 nm, although lesser and greater widths can also be employed. The height of the semiconductor material portion 104 can be from 10 nm to 200 nm, although lesser and greater heights can also be employed.

In some embodiments of the present application and when the hard mask layer is present, the hard mask layer that remains atop the semiconductor material portion 104 can be removed at this stage. The removal of the remaining non-etched portion of hard mask layer can be achieved by performing a selective etching process or by utilizing a planarization process such as chemical mechanical planarization (CMP).

The gate structure 102 includes a stack of deposited gate materials (referred to as a material stack). The material stack includes, for example, a sacrificial gate dielectric 108, a sacrificial gate 110 and a sacrificial gate cap 112. In some embodiments of the present application, the sacrificial gate dielectric 108 and/or the sacrificial gate cap 112 can be omitted.

When present, the sacrificial gate dielectric layer 108 includes a dielectric material such as an oxide or a nitride. In one embodiment, the sacrificial gate dielectric layer 108 can be a layer of silicon oxide, silicon nitride, or silicon oxynitride. The sacrificial gate dielectric layer 108 can be formed by a conventional deposition process, including but not limited to, CVD or PVD. The sacrificial gate dielectric layer 108 can also be formed by conversion of a surface portion of the semiconductor material portion 104. The conversion can include a thermal oxidation and/or a thermal nitridation process. The sacrificial gate dielectric layer 108 that is formed can have a thickness from 1 nm to 10 nm, although lesser and greater thicknesses can also be employed.

The sacrificial gate 110 can include a semiconductor material such as polysilicon or a silicon-containing semiconductor alloy such as a silicon-germanium alloy. The sacrificial gate 110 can also include a metal. The sacrificial gate 110 can be formed using CVD or PECVD. The sacrificial gate 110 that is formed can have a thickness from 102 nm to 300 nm, although lesser and greater thicknesses can also be employed.

The sacrificial gate cap 112 can include a dielectric material such as an oxide, a nitride or an oxynitride. In one embodiment, the sacrificial gate cap 112 is formed from silicon nitride. The sacrificial gate cap 112 can be formed utilizing a conventional deposition process including, for example, CVD and PECVD. The sacrificial gate cap 112 that is formed can have a thickness from 10 nm to 1020 nm, although lesser and greater thicknesses can also be employed.

The stack of materials forming the sacrificial gate dielectric layer 108, the sacrificial gate 110 and sacrificial gate cap 112 is then be patterned by lithography and etching techniques to form the gate structure 102. For example, a photoresist layer (not shown) can be applied over the topmost surface of the material stack and is lithographically patterned by lithographic exposure and development. The pattern in the photoresist layer is transferred into the material stack by an etch process, which can be an anisotropic etch such as, for example, RIE. The remaining portions of the material stack after the pattern transfer to form the gate structure 102. The remaining portions of the photoresist layer can be subsequently removed by, for example, ashing.

Figure 2:
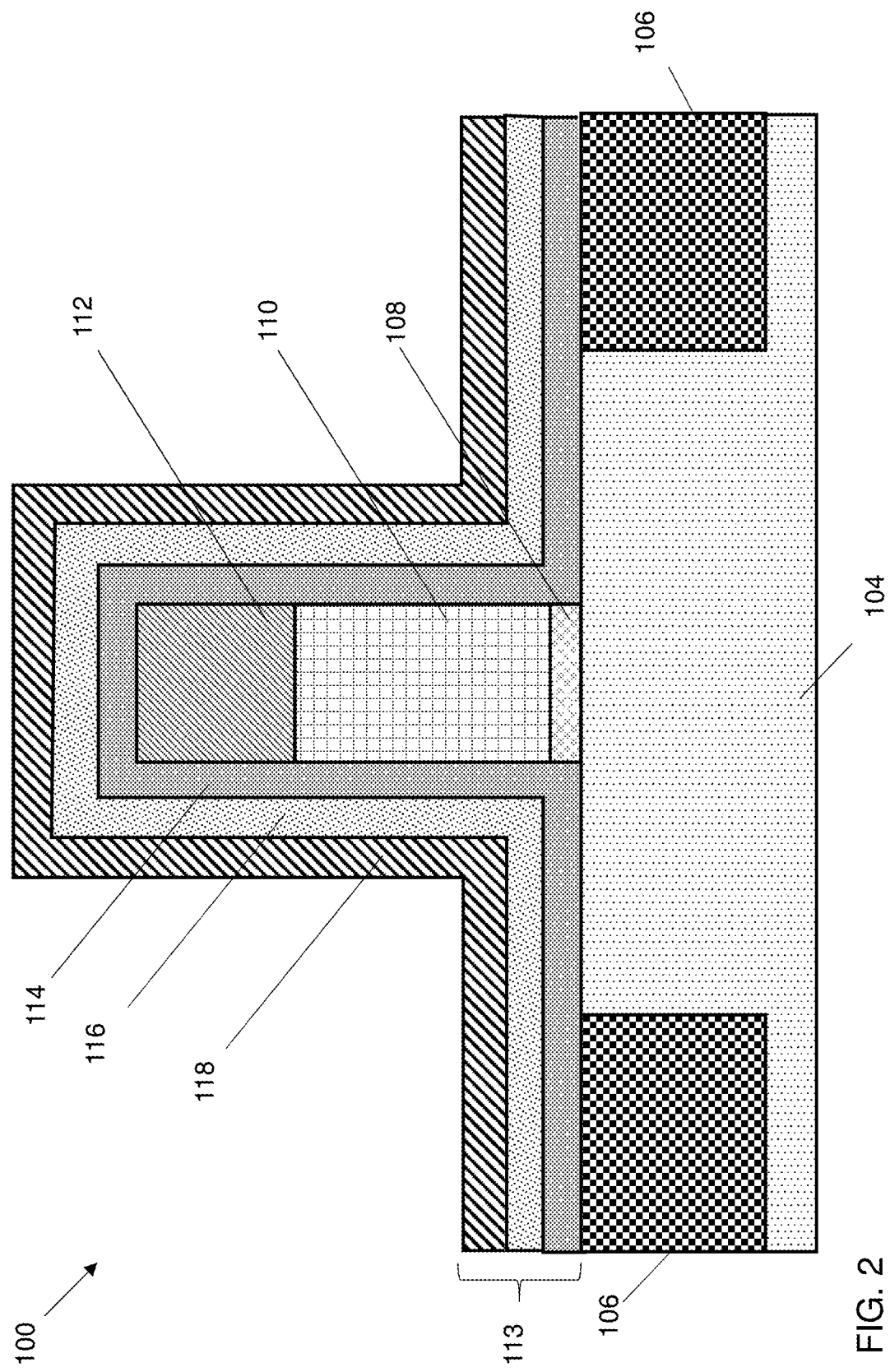

Turning to FIG. 2, a multi-layer stack 113 of spacer materials are deposited on the semiconductor structure 100. The spacer materials include a gate spacer material 114, a sacrificial material 116, and a contact spacer material 118. The multi-layer stack 113 can be formed by first performing a conformal deposition of the gate spacer material 114 on exposed surfaces of the gate material stack (108, 110, 112), and the semiconductor material portion 104. Various deposition processes can be used to deposit the gate spacer material 114 such as, for example, CVD, PECVD or atomic layer deposition (ALD). The gate spacer material 114 can be formed, for example, from silicon boron carbon nitride (SiBCN), and can have a thickness ranging, for example, from about 2 nm to about 5 nm.

Thereafter, a second conformal deposition process can be performed to deposit the sacrificial material 116 on an upper surface of the gate spacer material 114. Various deposition processes can be used to deposit the sacrificial material 116 such as, for example, CVD, PECVD or atomic layer deposition (ALD). The sacrificial material 116 can be formed, for example, from silicon oxide (SiO2), and can have a thickness ranging, for example, from about 2 nm to about 5 nm.

Lastly, a third conformal deposition process can be performed to deposit the contact spacer material 118 on an upper surface of the sacrificial material 116. Various deposition processes can be used to deposit the contact spacer material 118 such as, for example, CVD, PECVD or atomic layer deposition (ALD). The contact spacer material 118 can be formed, for example, from silicon nitride (SiN), and can have a thickness ranging, for example, from about 2 nm to about 5 nm.

Figure 3:
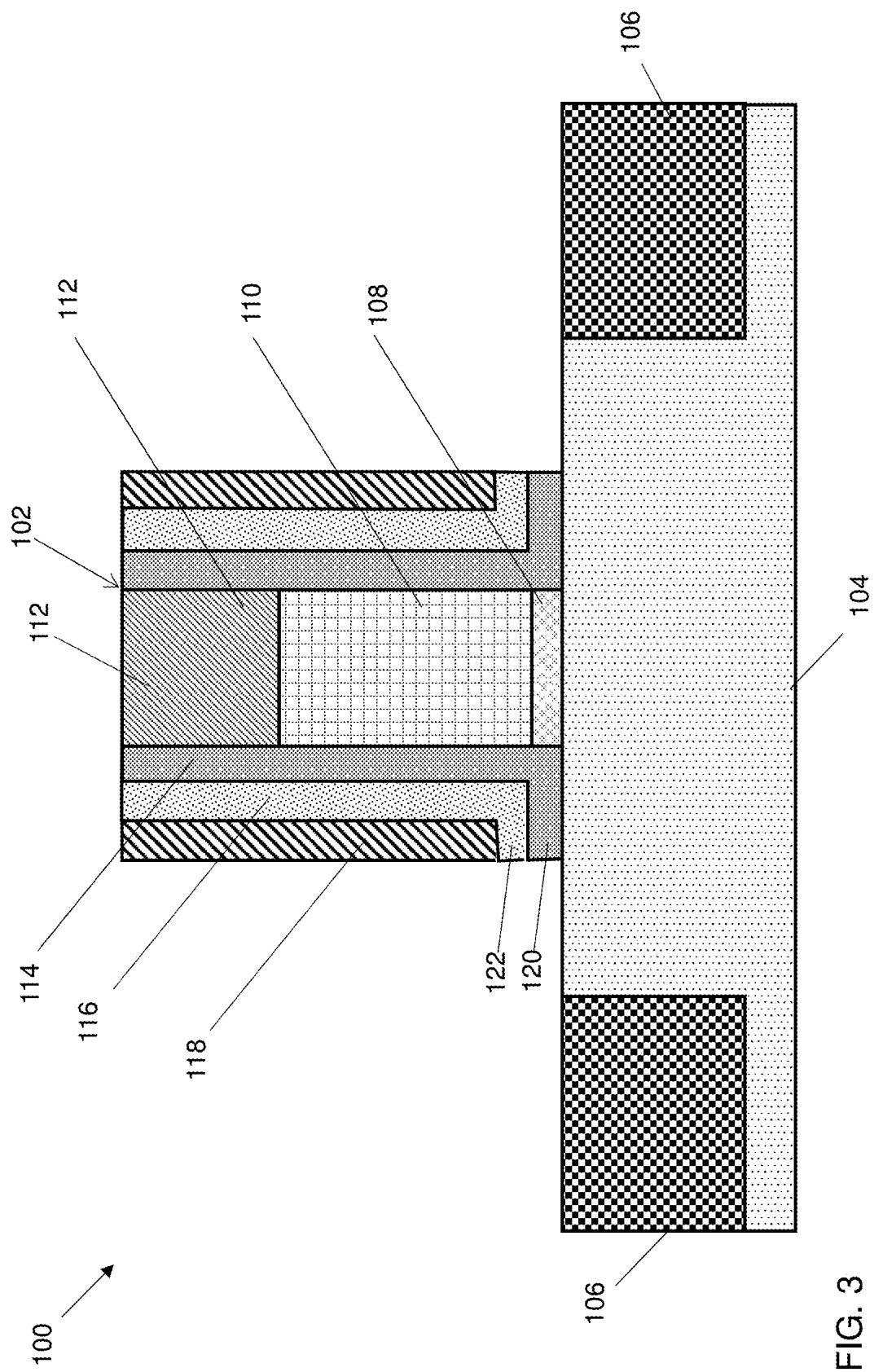

Referring to FIG. 3, the multi-layer stack 113 is etched to form a gate spacer 114 and a contact spacer 118. The multi-layer stack 113 can be etched using various etching techniques including, but not limited to, a dry etch process such as, for example, RIE. Accordingly, a gate spacer 114 is formed on sidewalls of the gate material stack (108, 110, 112), and the remaining sacrificial material 116 is located between the gate spacer 114 and the contact spacer 118. The region located between the gate spacer 114 and the contact spacer 118, including inner walls of the gate spacer and contact spacer 118, is viewed as a sacrificial region that can be further etched to form airgaps spacers ad described in greater detail below.

In one or more embodiments of the invention, etching the multi-layer stack 113 results in a unique structural relationship with respect to the gate spacer 114, the sacrificial material 116, and the contact spacer 118. For instance, the gate spacer 114 is formed having a base portion 120 on the upper surface of the semiconductor material portion 104, and the sacrificial layer 116 is formed having a sacrificial base portion 122 on an upper surface of the base portion 120 of the gate spacer 114. Accordingly, a lower portion of the contact spacer 118 is formed on an upper surface of the sacrificial base portion 122 of the sacrificial layer 116.

Figure 4:
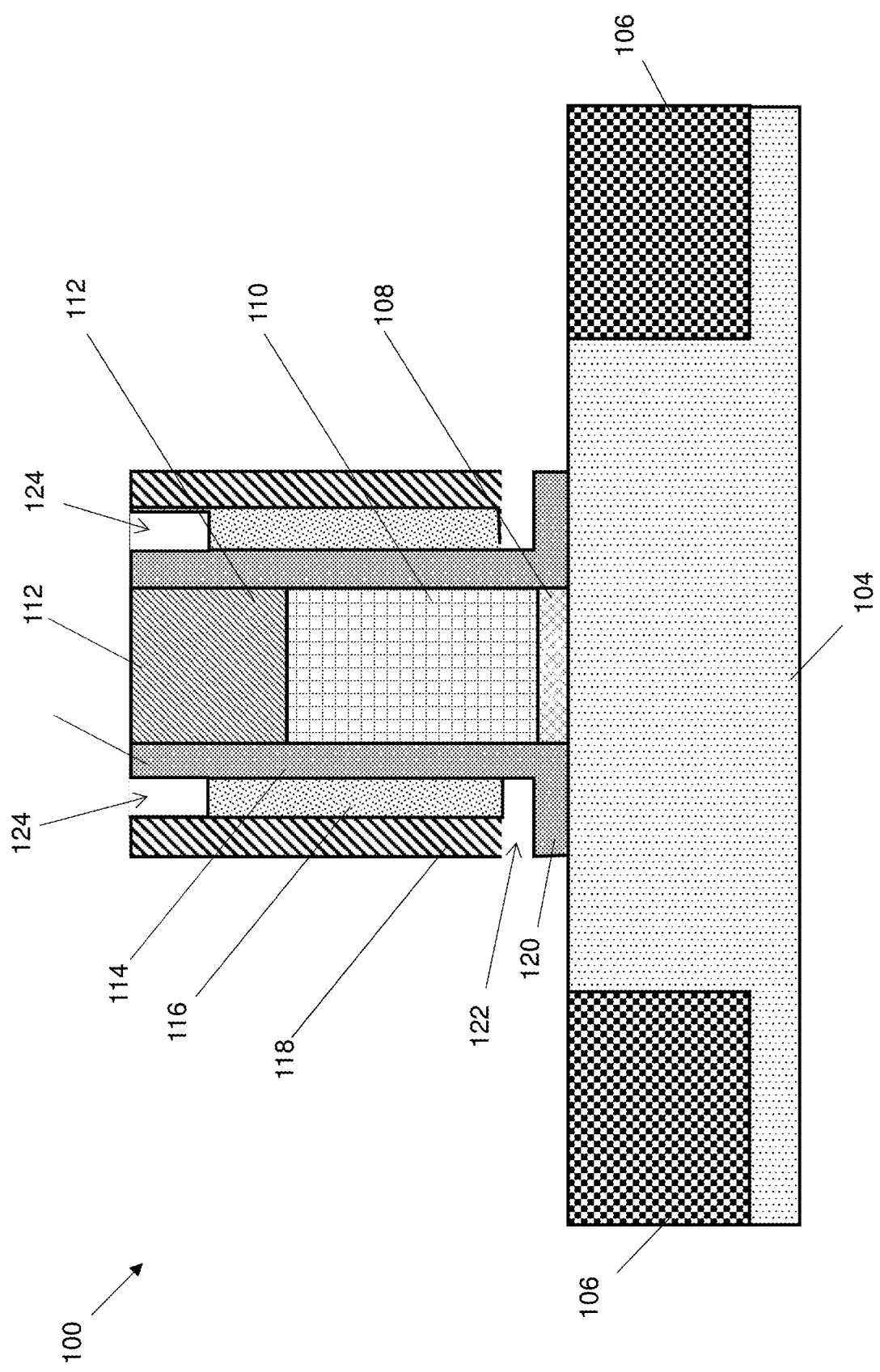

Turning to FIG. 4, the semiconductor structure 100 is illustrated after forming a lower divot 124 and an upper divot 126 in the sacrificial layer 116. The etch chemistry for the etching process used to form the divots can be selected such that the material of the sacrificial material 116 is recessed while the materials of the gate spacer 114 and the contact spacer 118 are substantially preserved. In some embodiments, the sacrificial layer 116 comprises silicon oxide and can be etched, for example, by a wet etch process such as an aqueous solution containing hydrofluoric acid, by a dry etch process such as plasma etch.

Figure 5:
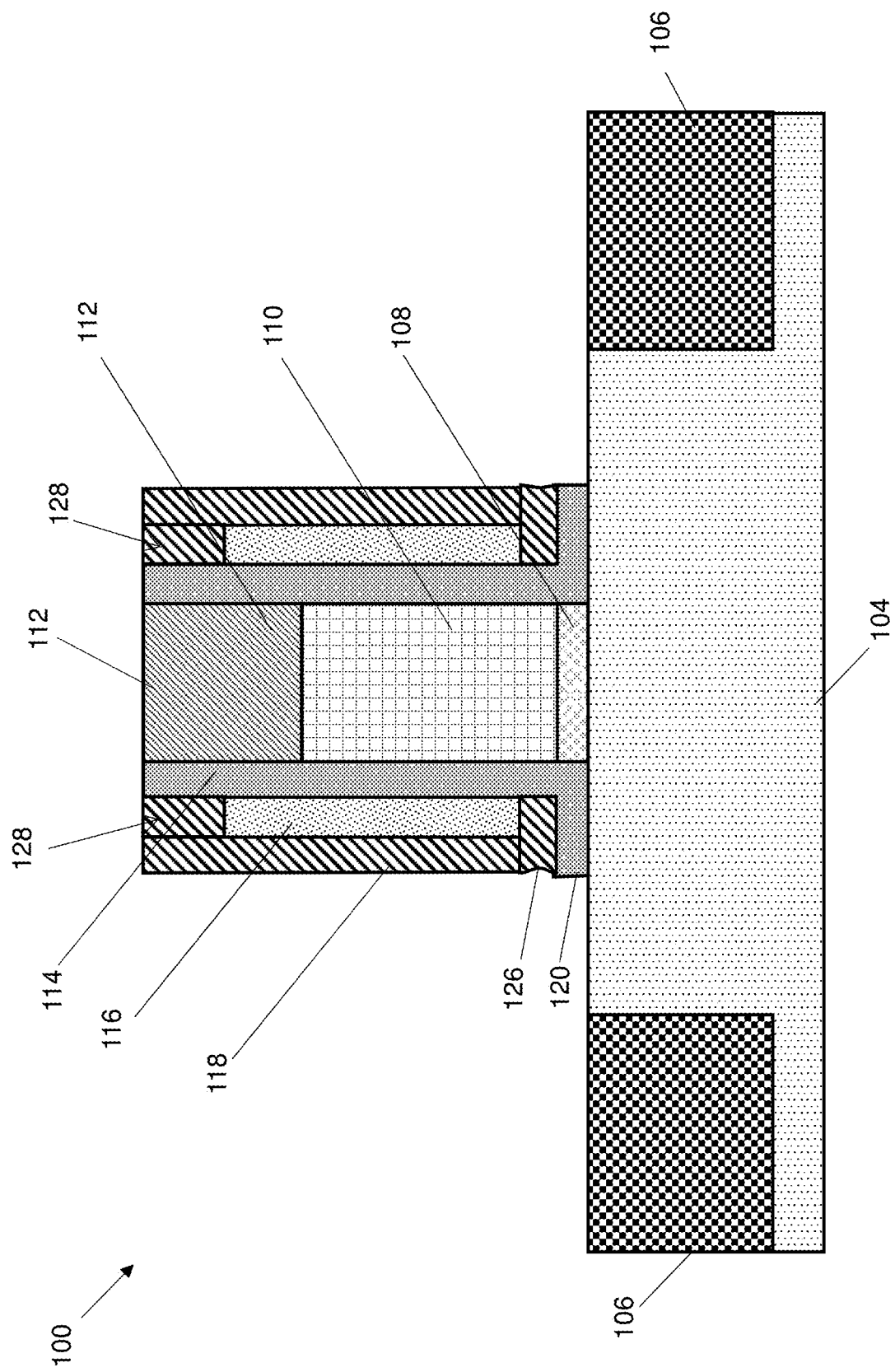

Referring to FIG. 5, the semiconductor structure 100 is illustrated following deposition of lower and upper divot plugs 126 and 128. Specifically, a hard mask material such as SiN, for example, can be deposited to fill the lower and upper divots 122 and 124. A subsequent etching process can then be performed to remove excess hardmask material from the surfaces of the semiconductor material portion 104 and the gate structure 102, thereby forming the lower divot plug 126 and the upper divot plug 128. Accordingly, the lower and upper divot plugs 126, 128 serve to seal and block the remaining sacrificial material 116 from exposure to subsequent epitaxy processes applied to the semiconductor structure 100. In addition, lower divot plug 126 effectively replaces the sacrificial base 122 of the sacrificial material 116. Accordingly, the lower end of the contact spacer 118 now directly contacts the lower divot plug 126.

Figure 6:
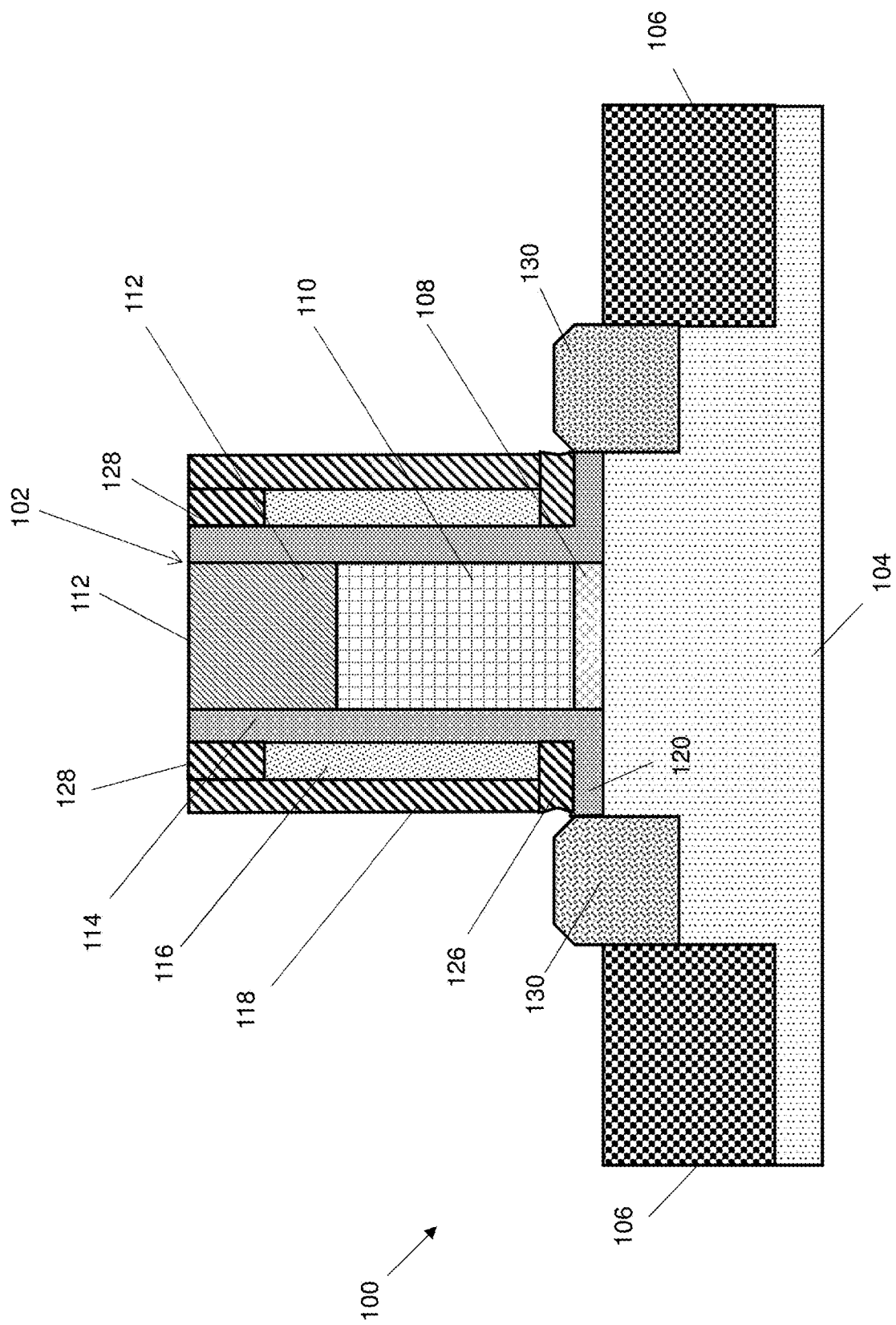

Turning to FIG. 6, the semiconductor structure 100 is illustrated following formation of opposing source/drains 130. As used herein, a "source/drain" region can be a source region or a drain region depending on subsequent wiring and application of voltages during operation of a FET. The source/drains 130 can be formed using a selective epitaxial process, which grows a semiconductor material on the exposed regions of the semiconductor material portion 104. In one or more embodiments of the invention, the exposed region of the semiconductor material portion 104 located between the trench isolation 106 and the contact spacer 118 can be partially etched, and then refilled by epitaxially growing the semiconductor material therein to form the source/drains 130. As mentioned above, divot plug 126 prevents epitaxial growth of the semiconductor material on the lower portions of the sacrificial material 116 and provides distance between the grown epitaxy material and the gate 110 to reduce source/drain-gate current leakage.

The semiconductor material forming the source/drains 130 can include, for example, Si, Ge, SiGe, SiP or SiC. In one embodiment, the source/drains 130 are composed of boron-doped SiGe for formation of p-type FETs. In another embodiment, the source/drains 130 are composed of phosphorus doped Si for formation of n-type FETs. In addition, the source/drains 130 can be formed as an intrinsic semiconductor material, or can be grown with in-situ doping. If the semiconductor material is grown as an intrinsic semiconductor material, the source/drains 130 can be subsequently doped (ex-situ) utilizing ion implantation, gas phase doping or dopant out diffusion from a sacrificial dopant source material.

Figure 7:
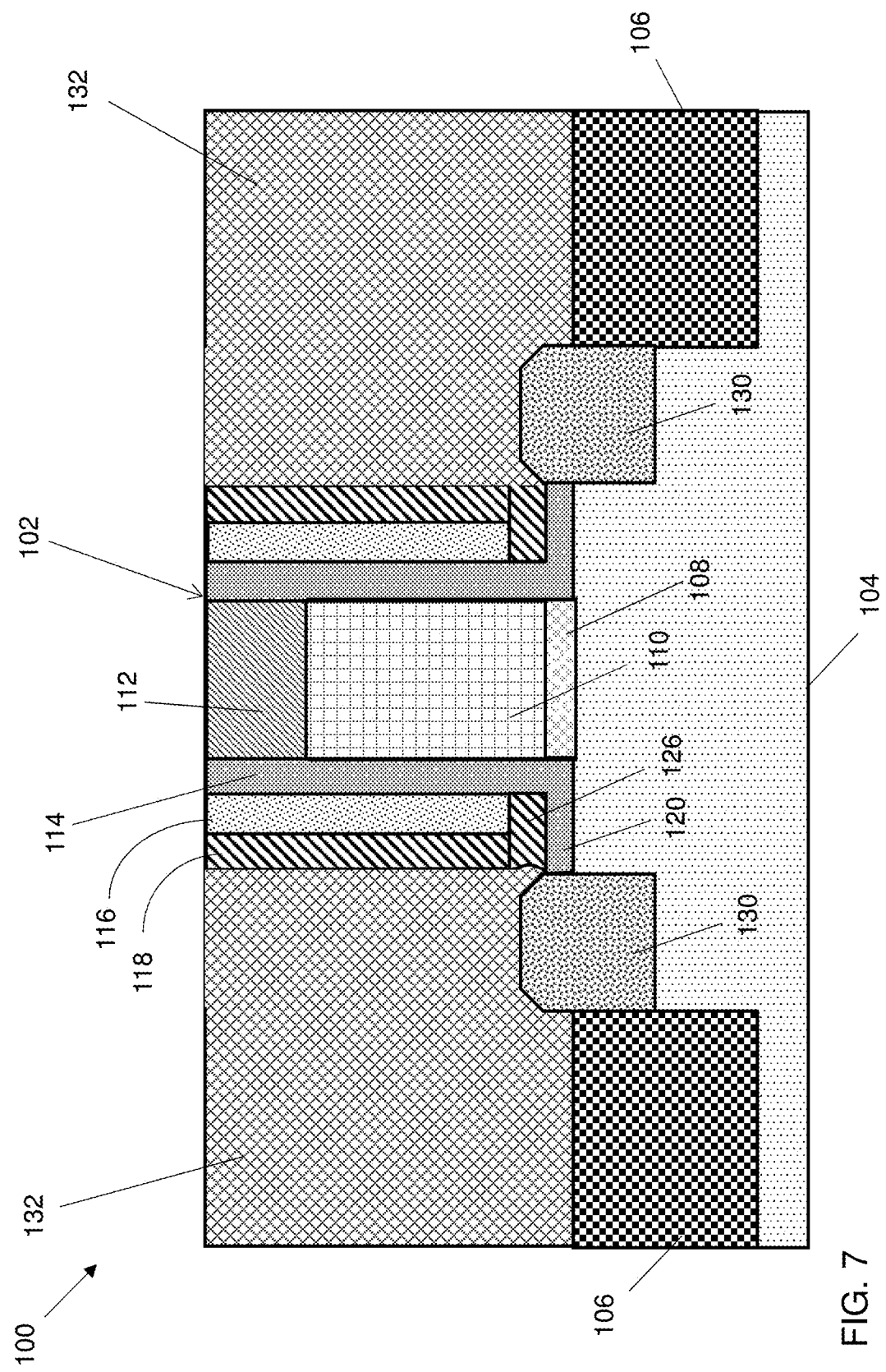

Referring to FIG. 7, after forming interlayer dielectric (ILD) 132 to cover the trench isolation regions 106 and the source/drains 130, and surround the gate structure 102. In some embodiments of the present application, the ILD layer 132 includes a dielectric material that can be easily planarized. For example, the ILD layer 132 can include a doped silicate glass, an undoped silicate glass (e.g., SiO2), an organosilicate glass (OSG), a porous dielectric material, or amorphous carbon. The ILD layer 132 can be deposited using a conventional deposition process such as, for example, CVD, PECVD or spin coating. The ILD layer 132 can be subsequently planarized, until exposing the upper surface of the sacrificial layer 116. The gate hardmask 112 can be initially filed with a thickness that allows it to be partially recessed without exposing the underlying sacrificial gate 110.

Figure 8:
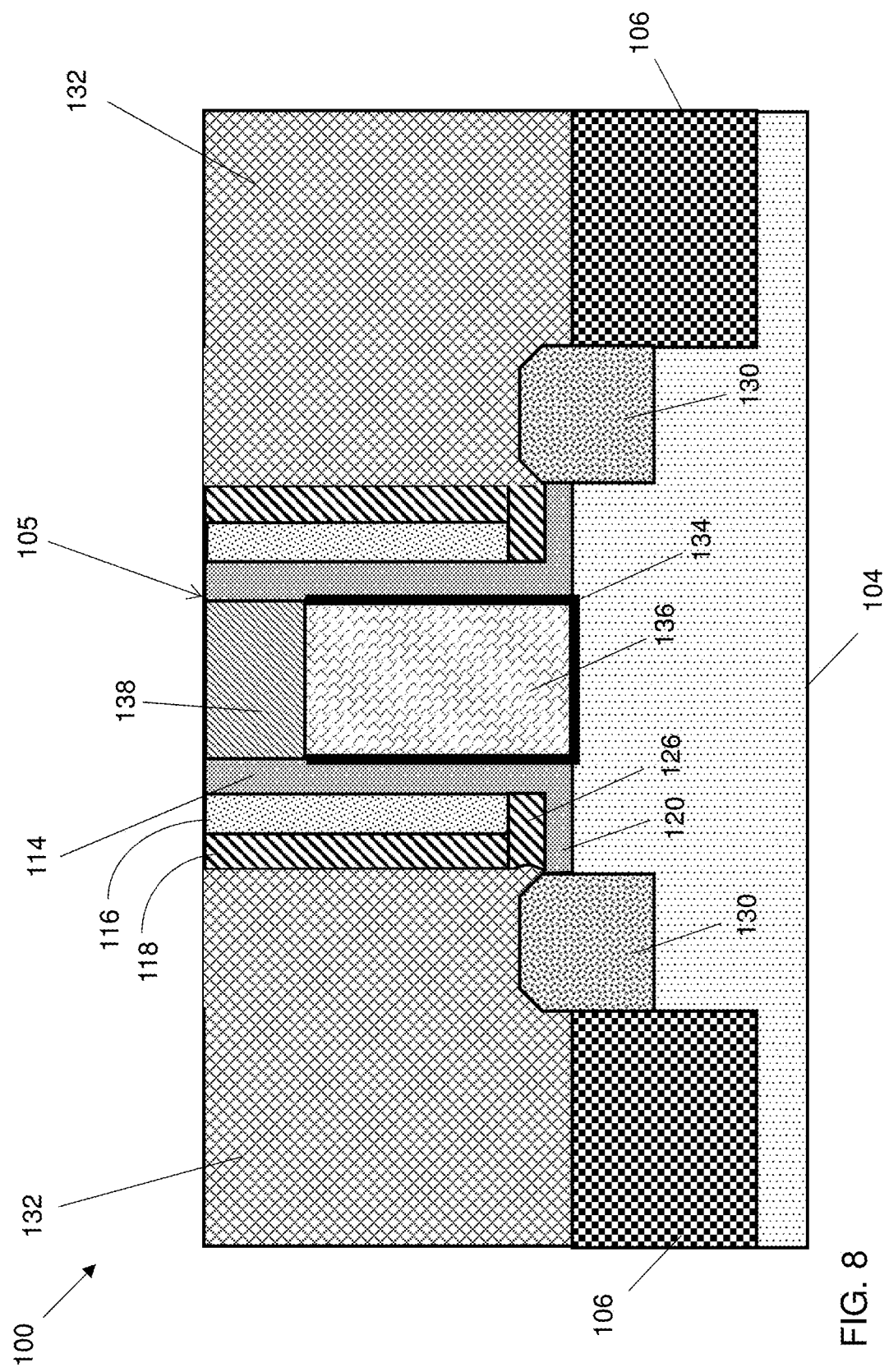

Turning to FIG. 8, the semiconductor structure 100 is illustrated following a replacement metal gate (RMG) process. The RMG process includes removing the sacrificial gate dielectric 108, the sacrificial gate 110 and the sacrificial gate cap 112 to form a gate void (not shown) between the gate spacers 114. The sacrificial gate dielectric 108, the sacrificial gate 110 and the sacrificial gate cap 112 can be removed using a wet etch such as an ammonia etch, for example, or a dry etch such as RIE process.

A stack of functional gate materials can then be formed in the gate void. The functional gate stack includes, for example, a gate dielectric 134, a gate electrode 136 and a gate cap 138. The functional gate stack (134, 136, 138), along with the gate spacers 114 can be viewed as functional gate structure 105, which can be used to control output current (i.e., flow of carriers in the channel) of a semiconducting device through electrical or magnetic fields.

The functional gate stack (134, 136, 138) can be formed by first depositing a conformal gate dielectric layer 134 on a bottom surface and sidewalls of a cavity and on the top surface of the semiconductor portion 104 exposed by the gate cavity. The gate dielectric layer 134 can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

Gate electrode 136 can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (HD, zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaC, TaMgC, carbon nanotube, conductive carbon, graphene, or any suitable combination of these materials. The gate electrode 136 may further comprise dopants that are incorporated during or after deposition. In some embodiments, the gate electrode 136 may further comprise a workfunction setting layer between the gate dielectric and the rest of gate electrode. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The portions of the gate electrode layer and the gate dielectric layer formed above the top surface of the ILD layer 132 can be removed, for example, by CMP. In some embodiments and as illustrated, the remaining portions of the gate electrode layer and the remaining portions of the gate dielectric layer can be recessed utilizing a dry etch or a wet etch.

A gate cap material 138 is then deposited over the gate dielectric 134 and the gate electrode 136 in the gate void to cover the gate electrode 136. Exemplary gate cap materials include, but are not limited to, silicon nitride, silicon carbide nitride (SiCN), or silicon boron carbon nitride (SiBCN). The deposition of the gate cap material can be performed utilizing a conventional deposition process such as, for example, CVD or PECVD. The deposited gate cap material can be subsequently planarized, for example, by CMP using the top surface of the ILD layer 32 as a polish stop to form the gate cap 138.

Figure 9:
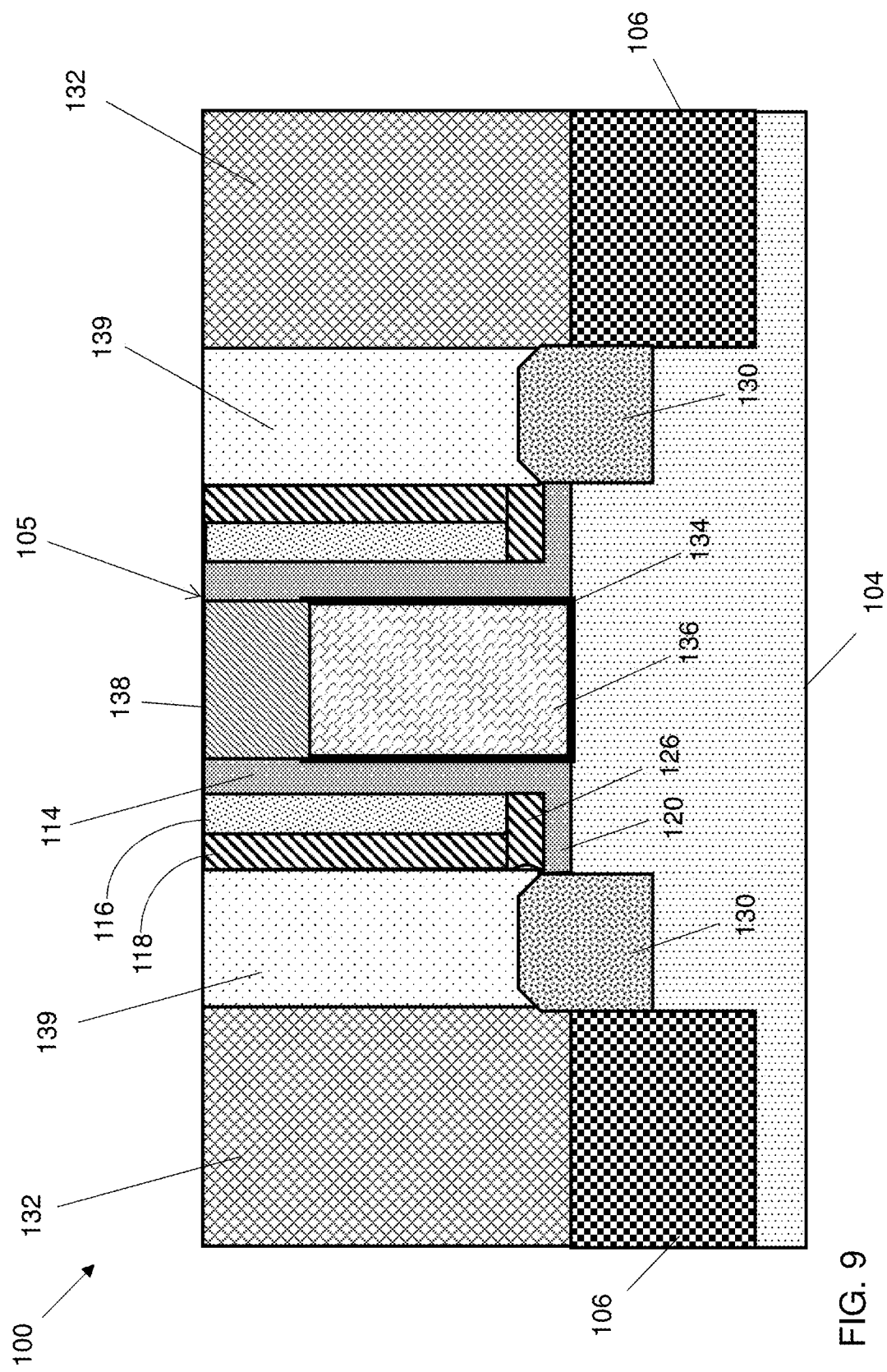

Referring to FIG. 9, portions of the ILD layer 132 are removed to provide source/drain contact openings (not shown), which expose the source/drain regions 130. In one or more embodiments, portions of the ILD 132 are removed to expose sidewalls of the contact spacer 118 such that the source/drain contacts opening 48 are laterally confined by a remaining portion of the ILD layer 132 and the contact spacer 118. The source/drain contact openings can be formed by applying a mask layer (not shown) over the ILD layer 132 and the functional gate structure 105, lithographically patterning the mask layer, and transferring the pattern into the ILD 132 to form the contact that expose the source/drains 130. In one or more embodiments of the invention, an RIE can be performed to remove the exposed portions of the ILD layer 132 to form the contact openings. After forming the source/drain contact openings, the remaining mask layer can be removed by oxygen-based or $N_2/H_2$-based plasma etching, for example.

In one or more embodiments of the invention, a metal semiconductor alloy region (not shown) can be formed on an upper surface of the source/drains 130. The metal semiconductor alloy regions can be composed of a silicide or germicide. In one or more embodiments of the invention, the metal semiconductor alloy regions can be formed by first depositing a metal layer (not shown) along sidewalls and the upper surface of the source/drains. The metal layer can include a metal such as Ni, Co, Pt, W, Ti, Ta, a rare earth metal (e.g., Er, Yt, La), an alloy thereof, or any combination thereof. The metal layer can be deposited by CVD, PVD or ALD. The thickness of the metal layer can be from 2 nm to 10 nm, although lesser and greater thicknesses can also be employed. A diffusion barrier (not shown) such as, for example, TiN or TaN, can then be formed over the metal layer.

An anneal process can be subsequently performed at an elevated temperature to induce reaction of the semiconductor material of the source/drain regions 130 to provide the metal semiconductor alloy regions. The unreacted portion of the metal layer, and, if present, the diffusion barrier, then removed, for example, by an etch process (or a plurality of etching processes). In one embodiment, the etching process can be a wet etch that removes the metal in the metal layer selective to the metal semiconductor alloy in the metal semiconductor alloy regions. The wet etch can be combined with a post-clean that removes any remnants of the metal layer from the outer sidewalls of the contact spacers 116 that are exposed by the source/drain contact openings.

Still referring to FIG. 9, a source/drain contact material is deposited in the contact openings (not shown) to form the source/drain contacts 139. The source/drain contacts 139 can include one or more source/drain contact liners (not shown) formed along sidewalls of the ILD 132 and contact spacer 118, along with an upper surface of the source/drains 130.

In one or more embodiments of the invention, a first contact liner layer (not shown) can include a diffusion barrier material that can block and/or absorb fluorine from WF6. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The first contact liner layer can be formed utilizing a conformal deposition process including CVD or ALD. The first contact liner layer that is formed can have a thickness ranging from 1 nm to 5 nm, although lesser and greater thicknesses can also be employed.

A first contact conductor layer (not shown) is subsequently deposited on the first contact liner layer to completely fill the source/drain contact openings. The first contact conductor layer can include a metal such as, for example, W, Cu, Al, Co, Ru, Mo, Os, Jr, Rh or an alloy thereof. The first contact conductor layer can be formed by any suitable deposition method such as, for example, CVD, PVD or plating.

Portions of the first contact conductor layer and the first contact liner layer (when provided) that are located above the top surface of the ILD layer 132 and functional gate structure 105 are removed by employing a planarization process, such as, for example, CMP. Remaining portions of the first contact liner layer located along the sidewalls and bottoms the source/drain contact openings can define source/drain contact liners (not shown), while remaining portions of the first contact conductor layer located within the source/drain contact openings forms the source/drain contacts 139.

Figure 10:
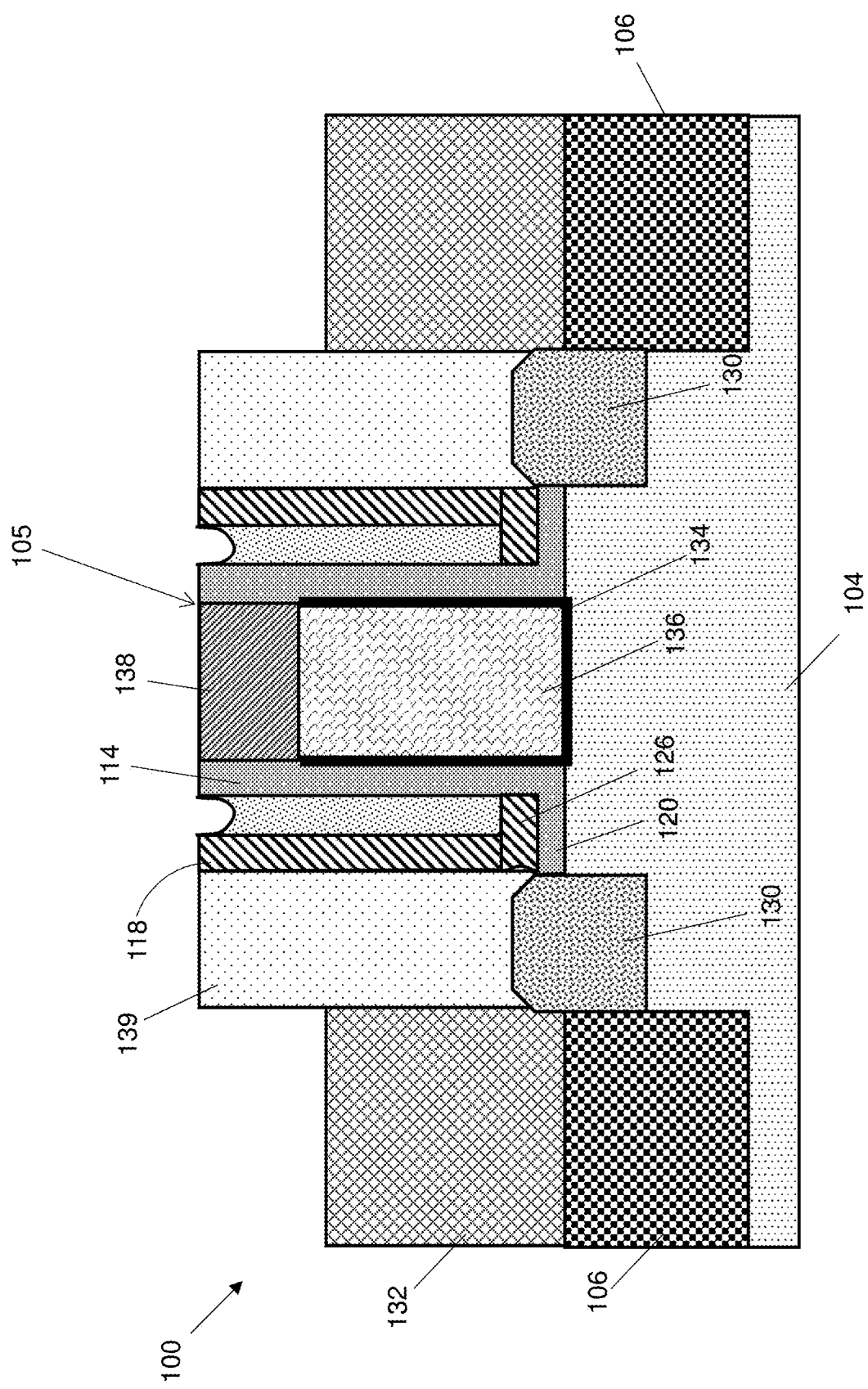

Turning now to FIG. 10, the semiconductor structure 100 is prepared to undergo a subsequent sacrificial layer removal process. More specifically, a portion of the ILD 132 is recessed below the upper surface of the source/drain contact 139. A wet etch such as an aqueous solution containing hydrofluoric acid or dry etch such as plasma etch or chemical oxide removal process. The etching processed used to recess the ILD 132 can also remove a small amount of the sacrificial material 116.

Figure 11:
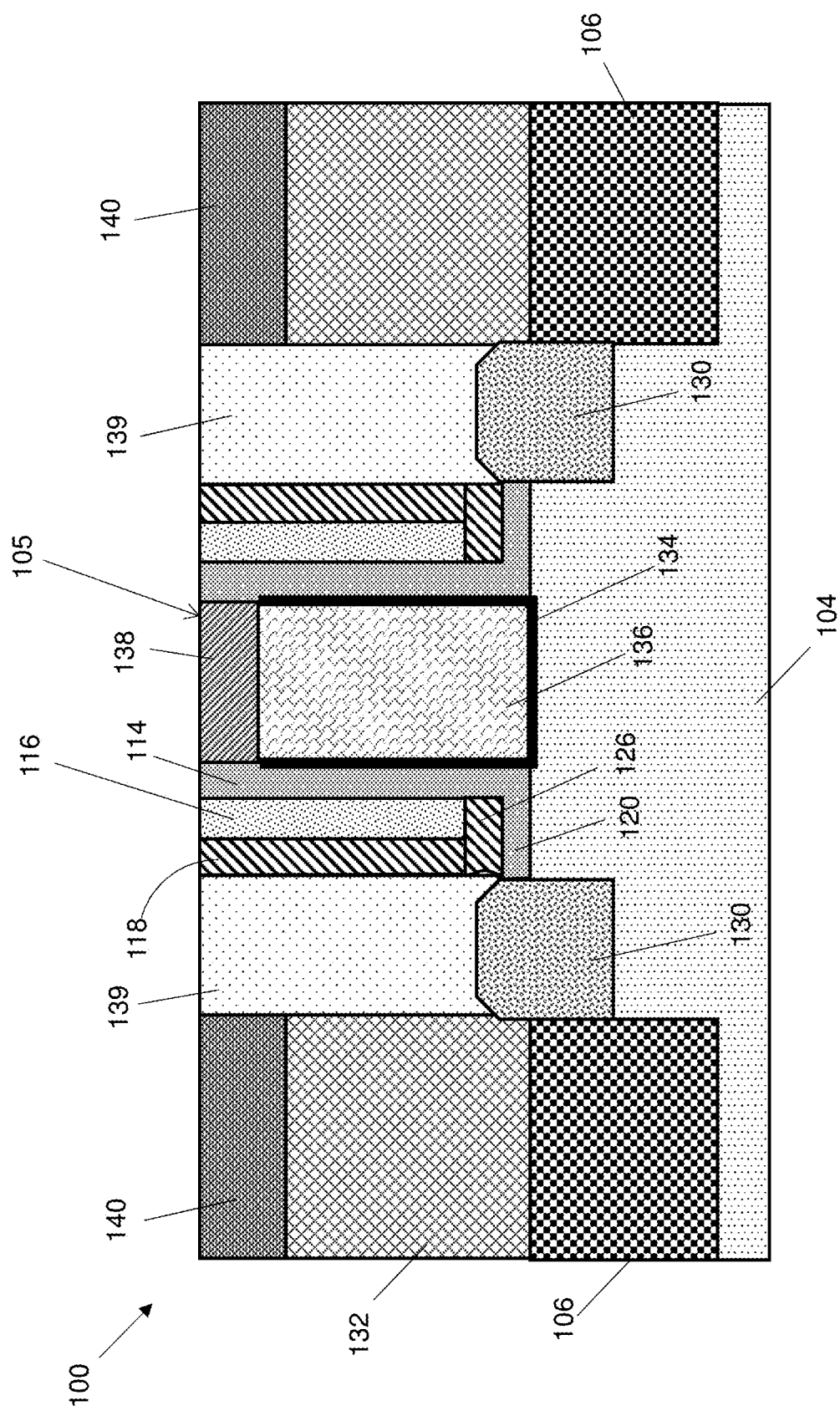

Referring to FIG. 11, the semiconductor structure 100 is illustrated after forming ILD caps 140 that cover the remaining ILD layer 132. The ILD caps can be deposited using a conventional deposition process. The deposition can be performed using ALD, CVD, or any other suitable deposition technique. Planarization can be performed by chemical-mechanical planarization (CMP) or any other suitable planairzation technique. The ILD caps 140 can be formed from various dielectric materials including, but not limited to, SiC. A planarization process can be performed after depositing the ILD cap material so that an upper surface of the ILD caps 140 are flush (i.e., co-planar) with the upper surface of the source/drain contacts 139. The gate cap 138 can be initially filed with a thickness that allows it to be partially recessed without exposing the underlying gate 136. The ILD caps 140 protect the underlying ILD dielectric during the subsequent process of removing sacrificial material 116 in the spacer.

Figure 12:
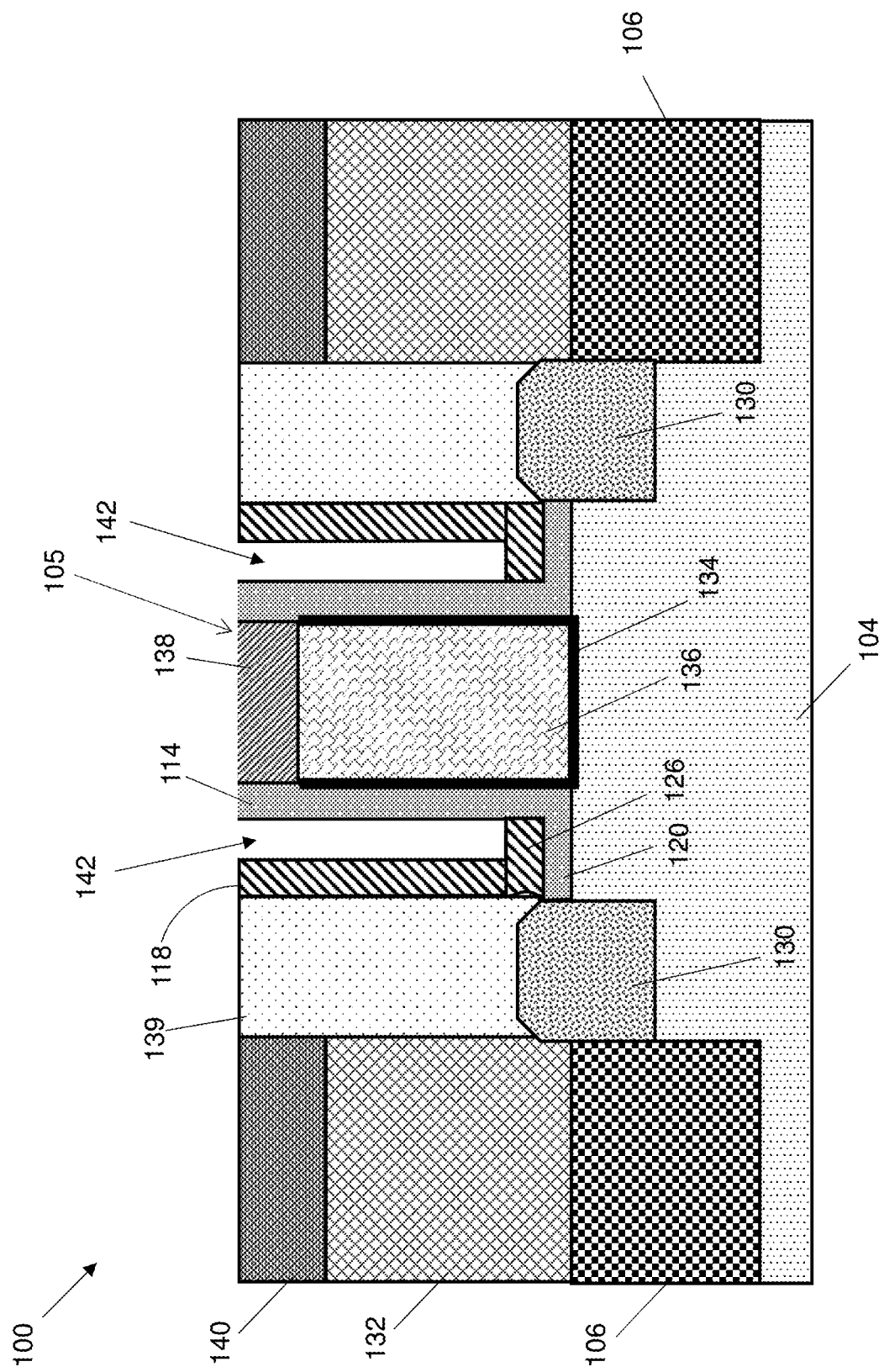

Turning to FIG. 12, the semiconductor structure 100 is illustrated after removing the sacrificial material 116. The sacrificial material can be removed using an etching process such as wet etch such as an aqueous solution containing hydrofluoric acid, dry etch such as plasma oxide etch or chemical oxide removal, or hydrofluoric vapor, for example, which employs a chemistry that is etch the sacrificial material 116 (e.g., silicon oxide) selective to other materials. Because the oxide material of the ILD 132 is protected by the ILD caps 140, the sacrificial material 116 can be etched away without damaging the ILD 132. Accordingly, spacer voids 142 are formed between the gate spacers 114 and the contact spacers 118.

Figure 13:
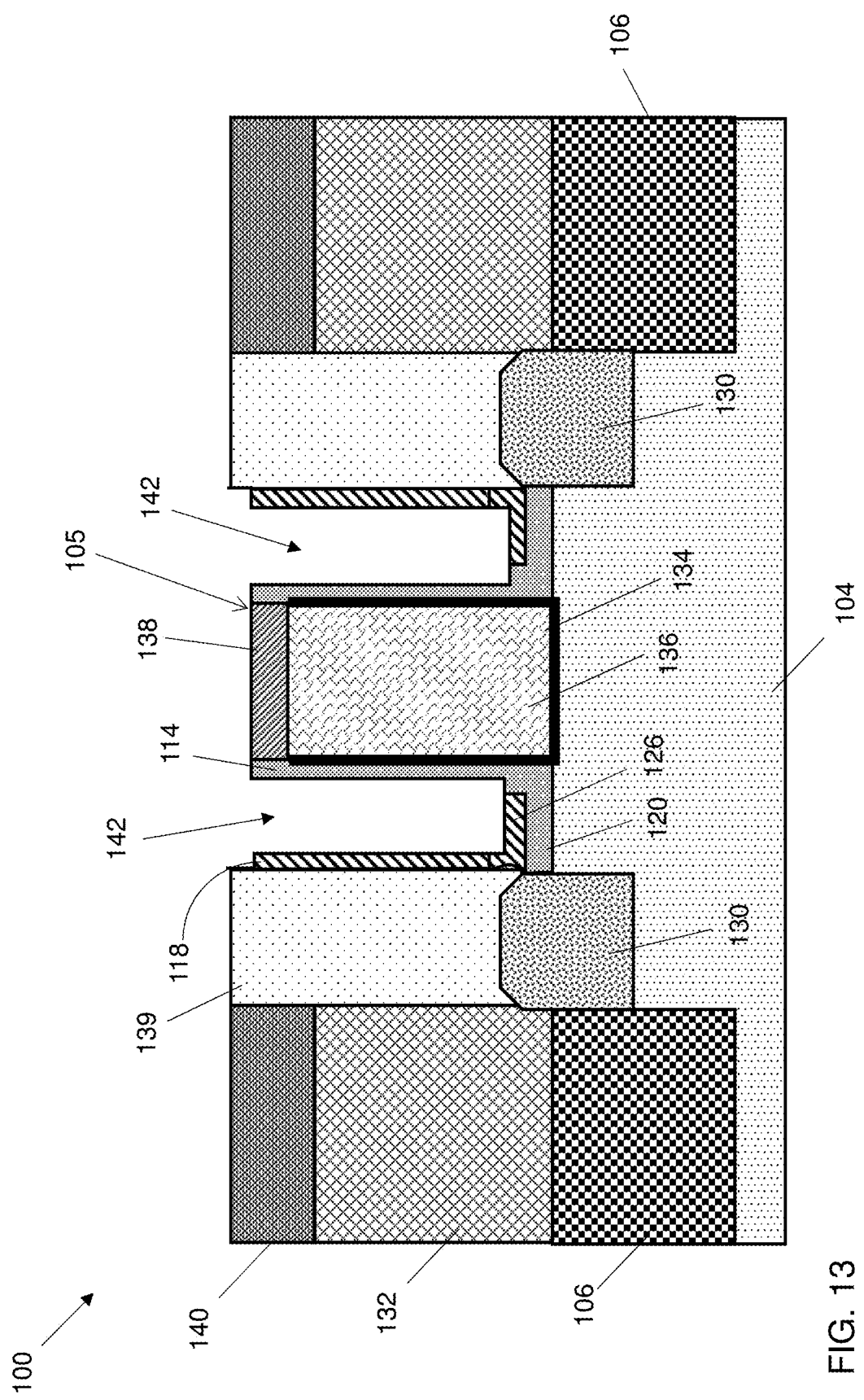

With reference to FIG. 13, the semiconductor structure 100 is illustrated after increasing the size of the spacer voids 142. More specifically, the sidewalls of the gate spacers 114 and the contact spacers 118 are partially recessed. In one or more embodiments of the invention, an isotropic etch (e.g., plasma etch) employing a chemistry that attacks a silicon-nitride based material can be performed to thin the gate spacers 114 and the contact spacers 118 without attacking the source/drain contacts 139 and the ILD caps 140. As mentioned above, the gate cap 138 can be initially filed with a thickness that allows it to be partially recessed without exposing the underlying gate 136. Accordingly, the size of the voids 142 are increased, thereby effectively enlarging the sacrificial region. The enlarged voids 142 also promote a pinching-off technique used when depositing a material in the spacer voids 142 as described in greater detail below.

Figure 14:
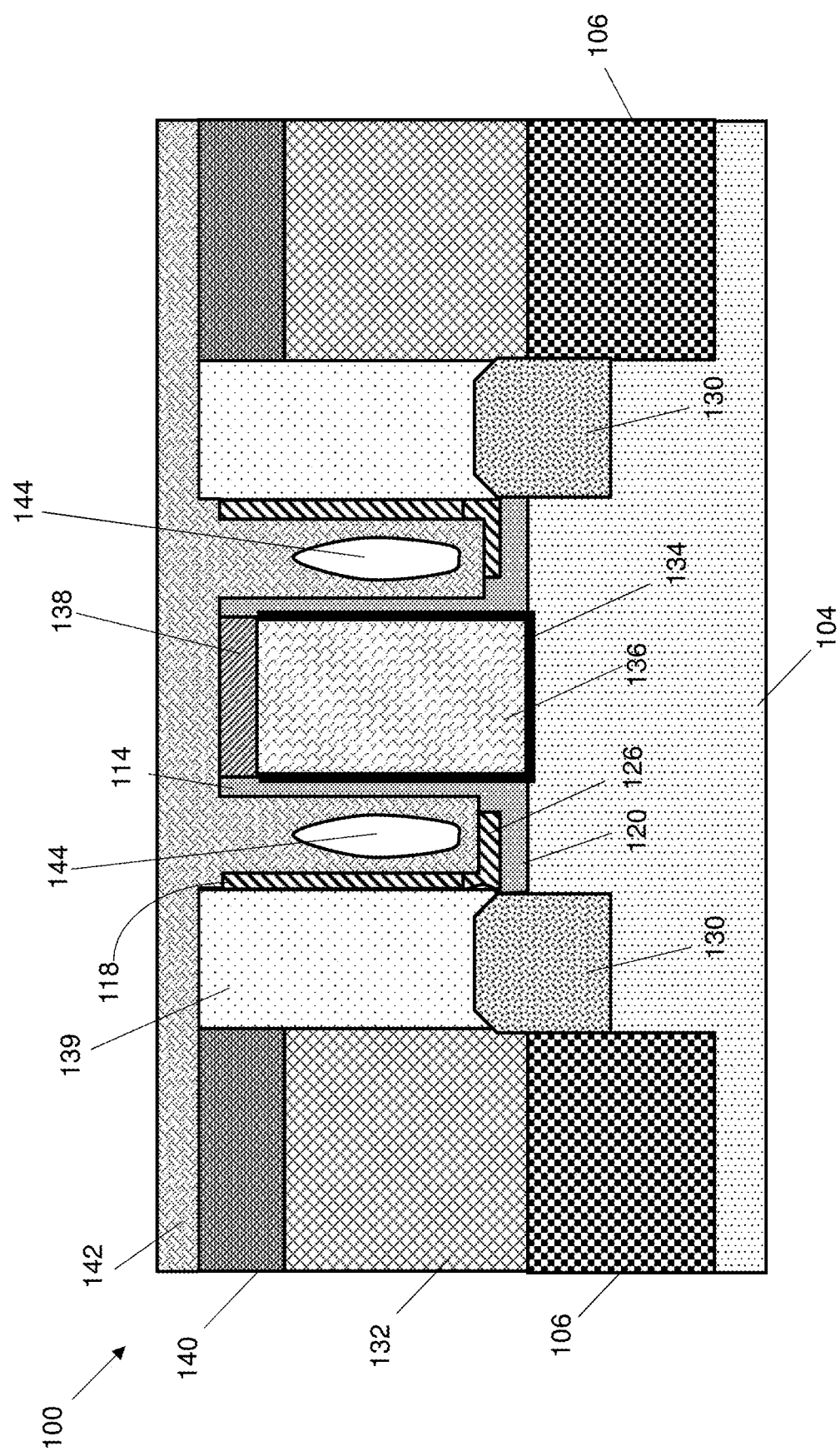

FIG. 14 depicts the semiconductor structure of FIG. 13 after depositing a dielectric material 144 in the enlarged spacer voids 142. In one or more embodiments of the invention, a dielectric material 144 including SiN, for example, is non-conformally deposited in the spacer voids 142 such that the upper portion of the dielectric material 144 pinches-off the opening of the spacer voids 142. In other words, the upper portion and lower portion of the void are completely filled without completely filling a middle portion of the voids 142. Accordingly, a pocket of air is trapped in the dielectric material to form an airgap 144. In some embodiments, the voids in the spacer can be formed by depositing multiple dielectric materials such as first depositing a SiN layer followed by depositing a SiOCN layer.

Figure 15:
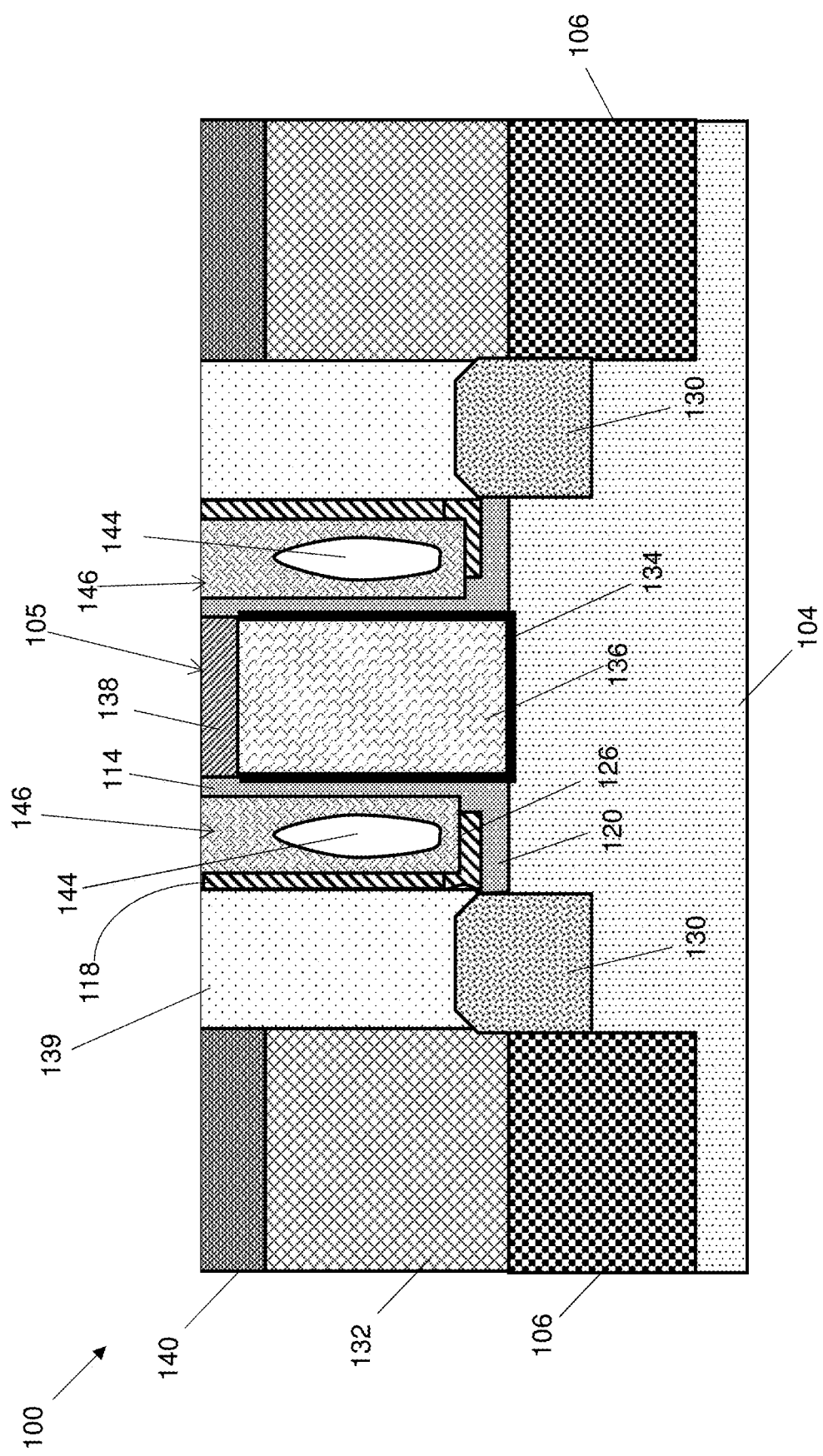

Turning to FIG. 15, the semiconductor structure 100 is illustrated after planarizing the excess portion of the dielectric material 142. Accordingly, airgap spacers 146 having the airgaps 144 trapped therein are formed between the source/drain contacts 139 and the gate structure 102. In one or more embodiments of the invention, each airgap spacer 146 is formed directly on an upper surface of a respective upper divot 126, and against the inner sidewalls of the gate spacer 114 and the contact spacer 118. In this manner, the airgap 144 included in the airgap spacers 146 serves to reduce the parasitic capacitance between the gate 136 and the source/drain contact 139.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
    forming a gate structure on a substrate;
    forming a sacrificial region between the gate structure and a contact spacer;
    recessing the gate structure and the contact spacer to enlarge the sacrificial region; and
    depositing a dielectric material in the enlarged sacrificial region to form an airgap between a remaining portion of the contact spacer and the gate structure,
    wherein forming the sacrificial region comprises:
        forming a sacrificial layer against a gate spacer of the gate structure;
        forming the contact spacer against a sidewall of the sacrificial layer; and
        removing the sacrificial layer to define a void in the sacrificial region between the contact spacer and the gate spacer, and
    wherein removing the sacrificial layer comprises:
        forming a sacrificial base portion of the sacrificial layer on a base portion of the gate spacer;
        forming the contact spacer on the sacrificial base portion;
        removing the sacrificial base portion while preserving the contact spacer and the base portion of the gate spacer to form a divot between the contact spacer, the base portion and a remaining portion of the sacrificial layer;
filling the divot with a hardmask material to form a divot plug; and
etching away the sacrificial layer while preserving the contact spacer, the base portion and the divot plug to define the void.

2. The method of claim 1, wherein the dielectric material is deposited so that an upper portion of the sacrificial region is completely filled without completely filling a middle portion of the sacrificial region to form the airgap.

3. The method of claim 2, wherein the airgap is located between an upper portion of the dielectric material and a lower portion of the dielectric material.

4. The method of claim 1, wherein enlarging the sacrificial region includes recessing a sidewall of the contact spacer and a sidewall of the gate spacer to increase a size of the void.

5. The method of claim 1, wherein the airgap is located between an upper portion of the dielectric material and the divot plug without etching the dielectric material.

6. A method for forming a semiconductor device including an airgap spacer, the method comprising:
forming a gate on a substrate;
forming a multi-layer spacer on sidewalls of the gate;
forming opposing lower and upper divots in a sacrificial layer of the multi-layer spacer;
filling the opposing divots with a hardmask material to form lower and upper divot plugs such that a remaining portion of the sacrificial layer is completely encased;
removing the upper divot plug and etching away the remaining portion of the sacrificial layer to form a void in the multi-layer spacer;
etching the multi-layer spacer to increase the size of the void; and
depositing a dielectric material in the void so that an upper portion and lower portion of the void are completely filled without completely filling a middle portion of the sacrificial region to form the airgap in the multi-layer spacer.

7. The method of claim 6 further comprising:
forming a source or drain (S/D) on the substrate and depositing an intermediate layer dielectric against the S/D;
depositing a dielectric cap to cover the intermediate layer dielectric; and
after depositing the dielectric cap, etching away the remaining portion of the sacrificial layer to form the void.

8. The method of claim 7, wherein forming the S/D comprises performing an epitaxy process to grow the S/D from an upper surface of the substrate while the upper and lower divot plugs and contact spacer isolate the sacrificial layer from the epitaxy process.

9. The method of claim 7, wherein forming the multi-layer spacer comprises:
forming a gate spacer layer on an upper surface of the gate and on the sidewalls of the gate;
forming a sacrificial layer on an upper surface of the gate spacer layer;
forming a contact spacer layer on an upper surface of the sacrificial layer such that the sacrificial layer is directly interposed between the gate spacer layer and the contact spacer layer; and
etching portions of the gate spacer layer, the sacrificial layer and the contact spacer layer to form the multi-layer spacer.

10. The method of claim 9, wherein the gate spacer layer comprises silicon boron carbon nitride (SiBCN), the sacrificial layer comprises silicon oxide ($SiO_2$), and the contact spacer layer comprises (SiN).

11. The method of claim 9, wherein etching the multi-layer spacer includes performing an etching process that recesses the gate spacer layer, the lower divot plug, and the contact spacer layer.

12. The method of claim 11, wherein the airgap is located between an upper portion of the dielectric material and the lower divot plug without etching the dielectric material.

13. A semiconductor device comprising:
a gate including a gate spacer formed on a semiconductor substrate and a source or drain (S/D) formed on the substrate a distance away from the gate;
a S/D contact including a contact spacer formed on an upper surface of the S/D;
a dielectric layer interposed between the gate spacer and the contact spacer; and
an airgap in the dielectric layer,
wherein the dielectric layer includes an upper dielectric portion and a lower dielectric portion, and wherein the airgap is interposed between the upper dielectric portion and the lower dielectric portion, and
wherein the gate spacer includes a base portion, and wherein the semiconductor device further comprises a divot plug on an upper surface of the base portion.

14. The semiconductor device of claim 13, wherein the divot plug is interposed between the base portion of the gate spacer and the lower portion of the dielectric layer.

15. The semiconductor device of claim 14, wherein the contact spacer is formed on the divot plug.

16. The semiconductor device of claim 15, wherein the gate spacer comprises silicon boron carbon nitride (SiBCN), the dielectric layer comprises silicon nitride (SiN), and the contact spacer comprises (SiN).

* * * * *